United States Patent
Brodsky et al.

(10) Patent No.: US 6,919,603 B2
(45) Date of Patent: Jul. 19, 2005

(54) EFFICIENT PROTECTION STRUCTURE FOR REVERSE PIN-TO-PIN ELECTROSTATIC DISCHARGE

(75) Inventors: Jonathan Brodsky, Richardson, TX (US); Robert Steinhoff, Dallas, TX (US); Sameer P. Pendharkar, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/426,448

(22) Filed: Apr. 30, 2003

(65) Prior Publication Data

US 2004/0217425 A1 Nov. 4, 2004

(51) Int. Cl.[7] .............................................. H01L 23/62
(52) U.S. Cl. ...................................... 257/361; 257/362
(58) Field of Search ................................. 257/361, 362

(56) References Cited

U.S. PATENT DOCUMENTS

| | | | |
|---|---|---|---|
| 4,692,781 A | | 9/1987 | Rountree et al. |
| 4,855,620 A | | 8/1989 | Duvvury et al. |
| 4,958,213 A | | 9/1990 | Eklund et al. |
| 5,012,317 A | | 4/1991 | Rountre |
| 5,196,981 A | | 3/1993 | Kuo |
| 5,808,342 A | * | 9/1998 | Chen et al. ................. 257/357 |
| 5,907,462 A | | 5/1999 | Chatterjee et al. |
| 5,949,109 A | * | 9/1999 | Shimizu et al. ............. 257/355 |
| 6,365,939 B1 | * | 4/2002 | Noguchi ..................... 257/355 |
| 2004/0016992 A1 | * | 1/2004 | Mallikarjunaswamy ..... 257/546 |

FOREIGN PATENT DOCUMENTS

| | | |
|---|---|---|
| DE | 100 46 668 A1 | 3/2001 |
| EP | 0 492 558 A2 | 7/1992 |
| GB | 2185621 A | 7/1987 |
| JP | 02252261 | 10/1990 |
| JP | 2003152163 | 5/2003 |

OTHER PUBLICATIONS

Rountree et al., "A Process–Tolerant Input Protection Circuit for Advanced CMOS Processes", 1988 EOS/ESD Symposium, pp. 201–205.

* cited by examiner

*Primary Examiner*—Phat X. Cao
(74) *Attorney, Agent, or Firm*—Peter K. McLarty; W. James Brady, III; Frederick J. Telecky, Jr.

(57) ABSTRACT

An electrostatic discharge (ESD) protection structure for protecting against ESD events between signal terminals is disclosed. ESD protection is provided in a first polarity, by a bipolar transistor (4C) formed in an n-well (64; 164), having a collector contact (72; 172) to one signal terminal (PIN1) and its emitter region (68; 168) and base (66; 166) connected to a second signal terminal (PIN2). For reverse polarity ESD protection, a diode (25) is formed in the same n-well (64; 164) by a p+ region (78; 178) connected to the second signal terminal (PIN2), serving as the anode. The cathode can correspond to the n-well (64; 164) itself, as contacted by the collector contact (72; 172). By using the same n-well (64; 164) for both devices, the integrated circuit chip area required to implement this pin-to-pin protection is much reduced.

21 Claims, 5 Drawing Sheets

EFFICIENT PROTECTION STRUCTURE FOR REVERSE PIN-TO-PIN ELECTROSTATIC DISCHARGE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to integrated structures for protecting such circuits from electrostatic discharge events.

Modern high-density integrated circuits are known to be vulnerable to damage from the electrostatic discharge (ESD) of a charged body (human or otherwise) as it physically contacts an integrated circuit. ESD damage occurs when the amount of charge exceeds the capability of the conduction path through the integrated circuit. The typical ESD failure mechanisms include thermal runaway resulting in junction shorting, and dielectric breakdown resulting in gate-junction shorting (e.g., in the metal-oxide-semiconductor, or MOS, context).

To avoid damage from ESD, modern integrated circuits incorporate ESD protection devices, or structures, at each external terminal. ESD protection devices generally operate by providing a high capacity conduction path, so that the brief but massive ESD charge may be safely conducted away from circuitry that is not capable of handling the event. In some cases, ESD protection is inherent to the particular terminal, as in the case of a power supply terminal, which connects to an extremely large p-n junction capable of absorbing the ESD charge. Inputs and outputs, on the other hand, typically have a separate ESD protection device added in parallel to the functional terminal. The ideal ESD protection device turns on quickly in response to an ESD event to safely and rapidly conduct the ESD charge, but remains off and presents no load during normal operation.

Examples of ESD protection devices are well known in the art. In the case of MOS technology, an early ESD protection device was provided by a parasitic thick-field oxide MOS transistor that was turned on by and conducted ESD current, as described in U.S. Pat. No. 4,692,781 and in U.S. Pat. No. 4,855,620, both assigned to Texas Instruments Incorporated and incorporated herein by this reference. As the feature sizes of MOS integrated circuits became smaller, and with the advent of complementary MOS (CMOS) technology, the most popular ESD protection devices utilized a parasitic bipolar device to conduct the ESD current, triggered by way of a silicon-controlled-rectifier (SCR) structure, as described in Rountree et al., "A Process-Tolerant Input Protection Circuit for Advanced CMOS Processes", 1988 *EOS/ESD Symposium*, pp. 201–205, incorporated herein by this reference, and in U.S. Pat. No. 5,012,317 and U.S. Pat. No. 5,907,462, both assigned to Texas Instruments Incorporated and also incorporated herein by this reference.

FIG. 1 illustrates an integrated circuit including conventional ESD protection circuits and structures, in which external terminals are protected from damage due to electrostatic discharge relative to device substrate ground. As shown in FIG. 1, external terminals PIN1, PIN2 serve as inputs, outputs, or both, for functional circuitry 10. External terminal GND is typically connected to the substrate of the integrated circuit, which serves as device ground. Those skilled in the art will understand that external terminals PIN1, PIN2, GND may be physically realized in various ways. Typically, these external terminals include a bond pad on the surface of the integrated circuit chip itself, which is connected by way of a bond wire or lead frame to an external terminal of the device package (such as a package pin, a package pad for surface mount packages, or a solder bump) or which is soldered directly to a land of a circuit board or multichip substrate. In any event, terminals PIN1, PIN2, GND are electrically connected outside of the integrated circuit to communicate signals or to receive a bias voltage, and as such are capable of receiving an electrostatic discharge.

In this conventional arrangement, the electrostatic discharge (ESD) from terminals PIN1, PIN2 to device ground GND is safely conducted by way of n-p-n transistors 4A, 4B, respectively. Referring to the example of the protection circuit for terminal PIN1, n-p-n transistor 4A has its collector connected to terminal PIN1 and its emitter connected to substrate ground GND, effectively in parallel with functional circuitry 10. Trigger 6A and resistor 7A are connected in series between terminal PIN1 and substrate ground GND, and the base of transistor 4A is connected to the node between trigger circuit 6A and resistor 7A. Typically, trigger 6A corresponds to a device or element that defines the turn-on of transistor 4A. In some cases, trigger 6A is not a particular component (i.e., simply a connection), in which case transistor 4A turns on when its base-collector junction breaks down (at a voltage $BV_{cbo}$) in response to a positive polarity ESD event. In another example, trigger 6A may be a capacitor, or an element such as a Zener diode that breaks down at a voltage that is exceeded by a significant positive polarity ESD event, with the voltage drop across resistor 7A due to this current forward-biasing the base-emitter junction of transistor 4A. Alternatively, this ESD protection scheme may instead involve a field effect device as transistor 4A, for example an n-channel MOSFET, as known in the art. In any case, transistor 4A safely conducts the ESD energy through a low-impedance path to substrate ground GND, ensuring that damaging densities of energy are not conducted through functional circuitry 10. During normal device operation, assuming a sufficiently high trigger voltage, transistors 4A, 4B remain off, and thus do not affect the operation of the integrated circuit.

Protection for negative polarity ESD events at terminals PIN1, PIN2 is provided by diodes 5A, 5B, respectively. Typically, diodes 5A, 5B are simply the parasitic diodes between the n-type region serving as the collector of transistors 4A, 4B and the p-type substrate. Diodes 5A, 5B are each forward-biased by negative ESD events at terminals PIN1, PIN2, respectively, so that the ESD energy is safely conducted through this low-impedance path. In normal operation, substrate ground GND is at a sufficiently low voltage relative to the specified voltages at terminals PIN1, PIN2 that these diodes 5A, 5B remain reverse-biased, and do not affect the voltage levels at terminals PIN1, PIN2 nor the operation of functional circuitry 10.

Some types of modern integrated circuits require ESD protection not only between terminals PIN1, PIN2 and substrate ground GND, but also require protection for ESD events between any given pair of its signal terminals (e.g., between terminals PIN1 and PIN2), not involving substrate ground GND. These types of circuits include so-called mixed signal integrated circuits, which include both digital and analog functions. Examples of such mixed signal devices include charge-pump circuits, voltage regulator circuits, boot-strap or "flying" gate drivers, and the like. FIG. 2 illustrates such an integrated circuit having a conventional ESD protection circuit between terminals PIN1, PIN2.

In this example, n-p-n transistor 4C has its collector connected to terminal PIN1 and its emitter connected to terminal PIN2. Trigger 6C and resistor 7C are also connected in series between terminals PIN1, PIN2, and the base of transistor 4C is connected to the node between trigger circuit 6C and resistor 7C. These devices protect functional circuitry 10 from damage due to ESD events of positive polarity at terminal PIN1 relative to terminal PIN2.

However, parasitic diode 5C at the collector of transistor 4C is not coupled to terminal PIN2, but instead is connected to the substrate, at substrate ground GND. As such, in the event of a negative polarity ESD event at terminal PIN1 relative to terminal PIN2, the voltage at which terminal PIN1 is clamped by either the series combination of structure 5C and structure 4B, or the structure of transistor 4C, will be higher than desirable for effective ESD protection performance. Instead, protection for negative polarity pin-to-pin ESD events is provided by isolated diode 15C, having its cathode at terminal PIN1 and its anode at terminal PIN2. Again, as in the case of FIG. 1, a negative polarity ESD event at terminal PIN1 relative to terminal PIN2 will forward bias isolated diode 15C, so that a low-impedance path for this energy will be provided, preventing damage to functional circuit 10.

Those skilled in the art having reference to this specification will realize that there is not a need to provide a mirror-image ESD structure between terminals PIN2, PIN1 (i.e., having an n-p-n transistor with its collector at terminal PIN2 and its emitter at PIN1). Rather, the circuit of FIG. 2, including isolated diode 15C, is capable of protecting both terminals PIN1, PIN2 in either direction.

The orientation of the ESD structure (specifically isolated diode 15C) between signal terminals PIN1, PIN2 should take into account situations in which functional circuitry 10 may permit the voltage on one signal terminal (e.g., PIN1) to exceed the voltage on another signal terminal (e.g., PIN2) in normal operation. In addition, as conventional in the art, similar ESD protection circuits are provided between each pair of terminals that are required to have such protection.

While the arrangement of FIG. 2 provides excellent ESD protection for all combinations of ESD events, conventional implementations of the pin-to-pin protection, particularly in providing the additional isolated diode 15C as shown in FIG. 2, have been inefficient in practice. FIG. 3 illustrates the conventional physical implementation of the pin-to-pin ESD protection circuit illustrated in FIG. 2, in a cross-sectional view.

In the conventional example illustrated in FIG. 3, the integrated circuit is formed into lightly-doped p-type substrate 30. N-type buried layer 32 is a heavily doped n-type region that underlies a portion of the surface of substrate 30, and provides a subcollector for n-p-n transistor 4C. The collector of transistor 4C is provided by n-well 34, disposed above n-type buried layer 32, and the base of transistor 4C is p-type region 36 that is diffused into n-well 34 from the surface. The emitter of transistor 4C is implemented by n+ region 38 diffused into p-region 36; n+ region is connected to signal terminal PIN2 by a metal conductor (not shown). P+ region 40 is also disposed within p-region 36, and is connected to signal terminal PIN2 by way of resistor 7C, typically a polysilicon or a diffused resistor, and a corresponding metal conductor (not shown). The subcollector at n-type buried layer 32 is connected to signal terminal PIN1 by way of buried contact 44 (typically a heavily doped buried region), overlying n+ region 42, and a corresponding metal conductor (not shown).

In this example, trigger 6C is simply the connection to collector region 42 and collector region 42 itself. A positive ESD event of sufficient energy between signal terminals PIN1, PIN2 will break down the collector base junction of transistor 4C. The breakdown current will flow into the base of transistor 4C, and to signal terminal PIN2 through resistor 7C, forward biasing the emitter-base junction and initiating bipolar conduction. Once transistor 4C is turned-on, collector-emitter current will be safely conducted from signal terminal PIN1 through n+ region 42, buried contact 44, n-type buried layer 32, n-well 34, p-type region 36, and n+ region 38.

In this conventional arrangement, negative polarity ESD events are handled by isolated diode 15C. Isolated diode 15C has an anode formed by p+ region 48 that is disposed within n-well 46, and a cathode formed by n+ region 50, also within n-well 46. P+ region 48 and n+ region 50 are connected to signal terminals PIN2, PIN1, respectively, by conventional metal conductors (not shown). Parasitic diode 5C is provided between n+ region 50 and n-well 46, and p-type substrate 46. In this arrangement, a negative polarity ESD event at signal terminal PIN1 relative to signal terminal PIN2 will forward bias isolated diode 15C, which safely conducts the ESD energy between these signal terminals.

However, in this conventional arrangement as shown in FIG. 3, the second instance of n-well 46 that is provided for isolated diode 15C occupies a large amount of silicon area. In particular, conventional integrated circuits typically have a design rule that specifies the minimum acceptable spacing between adjacent n-wells, primarily to avoid punch-through. In the example of FIG. 3, this well-to-well spacing between adjacent n-wells 34, 46 is illustrated by distance WW. A typical specification for distance WW in a conventional mixed signal device having high voltage capability is 15 to 20 μm. Especially considering that a corresponding isolated diode 15C is required between each pair of signal terminals in the device, the area required for the diode and the well-to-well spacing can become significant.

BRIEF SUMMARY OF THE INVENTION

It is therefore an object of this invention to provide an electrostatic discharge (ESD) protection structure that provide forward and reverse polarity protection between device signal terminals.

It is a further object of this invention to provide a structure that is especially efficient to implement, from the standpoint of device area.

It is a further object of this invention to provide such a structure in which parasitic resistance is reduced.

It is a further object of this invention to provide such a structure that is suitable for use in high-voltage and mixed signal applications.

It is a further object of this invention to provide such a structure that reduces the parasitic resistance in the connections from the signal terminals of the device to the reverse polarity portion of the structure.

Other objects and advantages of this invention will be apparent to those of ordinary skill in the art having reference to the following specification together with its drawings.

The present invention may be implemented by forming an electrostatic discharge protection structure, connected between two signal terminals of an integrated circuit. The structure includes both a transistor and a reverse-polarity protection diode within a common well. In the example of a bipolar protection transistor, the common well has the same conductivity type as that of the collector of the bipolar transistor. The first signal terminal is connected to the collector of the bipolar transistor, while the second signal terminal is connected to the emitter of the bipolar transistor and is resistively connected to the base of that transistor. The first and second signal terminals are connected to the cathode and anode of the diode. The bipolar transistor conducts ESD energy of a first polarity and the diode conducts ESD energy of the reverse polarity. The diode is constructed to have a reverse breakdown voltage greater than the triggering voltage of the bipolar transistor, so that the diode does not affect normal operation of the integrated circuit, and is not damaged by ESD stress of the first polarity.

DETAILED DESCRIPTION OF THE INVENTION

The present invention will be described in connection with its preferred embodiments, and specifically in connection with an example of this preferred embodiment of the invention involving an integrated circuit constructed according to a conventional bipolar and complementary metal-oxide-semiconductor (BiCMOS) technology. It is to be understood that this description is provided by way of example only, and is not to unduly limit the true scope of this invention as claimed.

Figure 4:
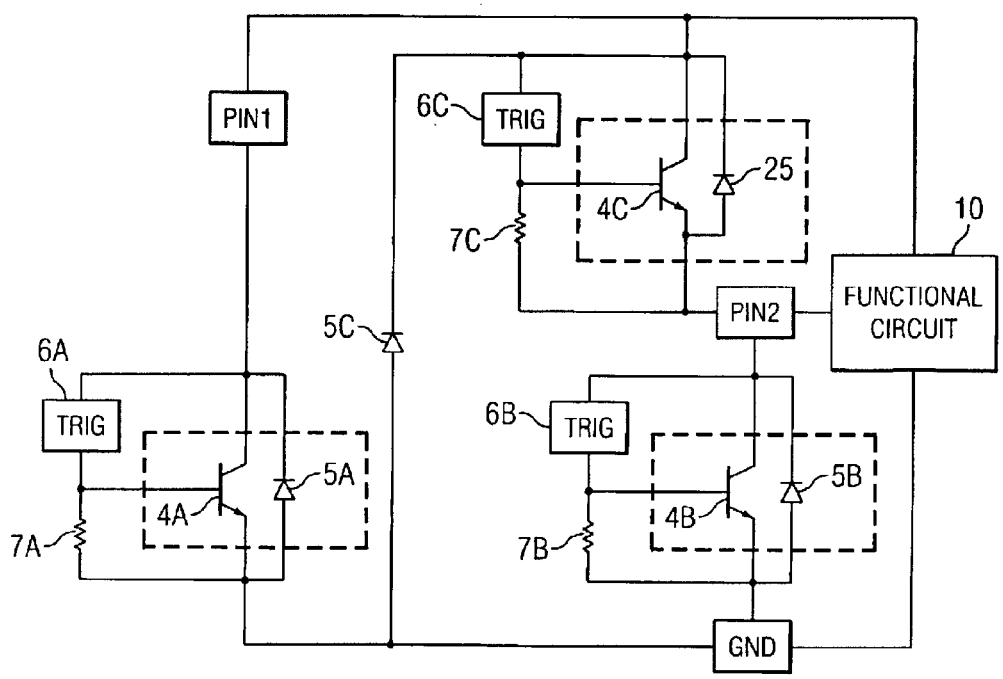
FIG. 4 is an electrical diagram, in schematic form, of a electrostatic discharge (ESD) protection circuit according to the preferred embodiments of the invention.

FIG. 4 illustrates, by way of an electrical schematic, an example of an integrated circuit incorporating an ESD protection circuit according to the preferred embodiment of the invention. It is contemplated that the integrated circuit of FIG. 4 is a single-"chip" integrated circuit, in which the elements shown in FIG. 4 are all realized on the same integrated circuit device. This integrated circuit thus has a plurality of terminals for making connection to circuitry external to the integrated circuit; it is at these terminals that protection against electrostatic discharge (ESD) events is to be provided. More specifically, this invention is directed to providing ESD protection between signal pins, safely conducting ESD energy and current between the two signal pins so that the functional circuitry is not damaged by the ESD event.

Figure 1:
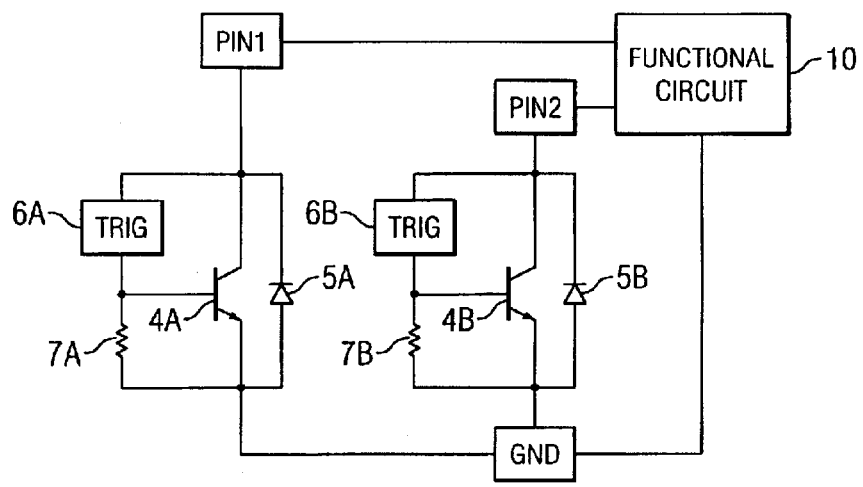
FIG. 1 is an electrical diagram, in schematic form, of a conventional electrostatic discharge (ESD) protection circuit.
Figure 2:
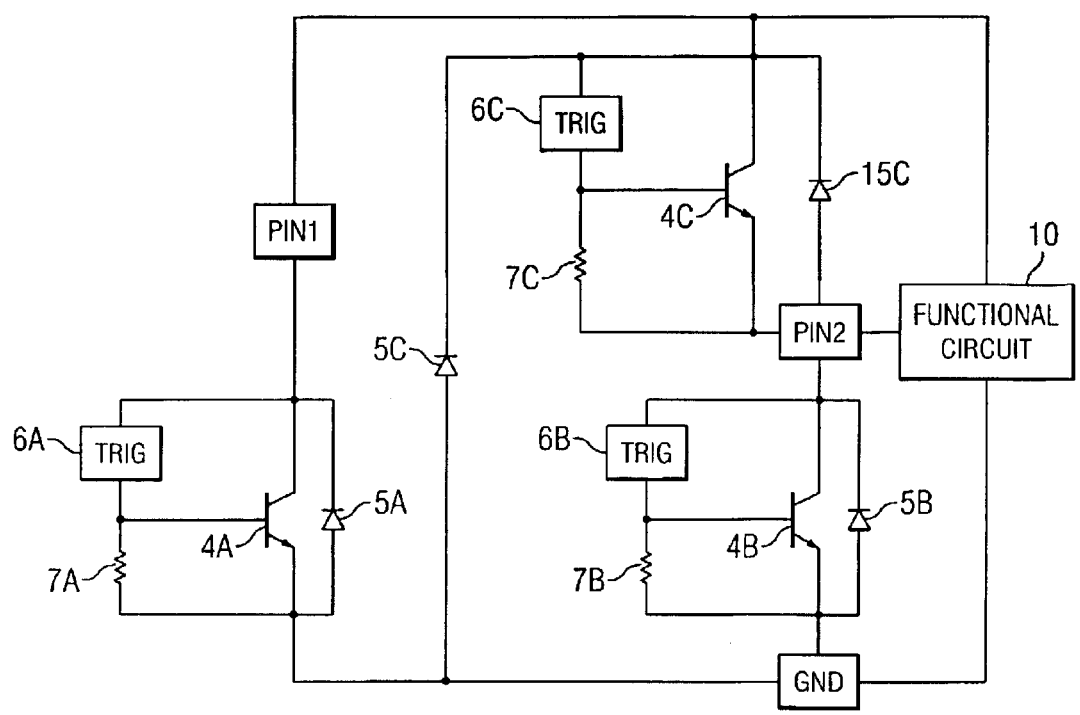
FIG. 2 is an electrical diagram, in schematic form, of a conventional electrostatic discharge (ESD) protection circuit that provides protection between signal pins.

Conventional ESD protection circuits were described above, in the Background of the Invention, relative to FIGS. 1 and 2. As evident from those Figures and from FIG. 4, some elements in the conventional ESD protection circuits are also present in the ESD circuitry according to the preferred embodiments of this invention. For the sake of clarity, the same reference numerals are used in this FIG. 4 to refer to those circuit elements that are the same as those in FIGS. 1 and 2.

In this example, external terminals PIN1, PIN2 serve as signal terminals (inputs, outputs, or common I/O terminals) connected to functional circuitry 10. External terminal GND is typically connected to the substrate of the integrated circuit, and as such can absorb a great deal of transient charge at its p-n junctions; accordingly, the substrate typically serves as device ground. Those skilled in the art will understand that external terminals PIN1, PIN2, GND may be physically realized in various ways. These external terminals include at least a so-called bond pad on the integrated circuit, to which connection may be readily to an external pin or pad of an integrated circuit package, a substrate in a multi-chip module, or to a circuit board. These connections may be made by way of a conventional wire bond to a package header or lead frame; by way of a solder bump to a package header, lead frame, or circuit board; or by way of a tape or beam lead in other types of packages. In any event, external signal terminals PIN1, PIN2 are electrically connected outside of the integrated circuit to communicate signals to or from the functional circuitry, and external terminal GND is receives a reference voltage. Of course, other terminals, including other signal terminals and power supply terminals, are also provided within the integrated circuit; only signal terminals PIN1, PIN2 and reference voltage terminal GND, are illustrated in FIG. 4, for the sake of clarity.

Each of these external terminals are exposed to electrostatic discharge (ESD) events. Typically, an ESD event is in the form of an extremely high voltage with a finite, but large, amount of charge that is discharged through the integrated circuit. The function of the ESD protection circuit in the preferred embodiments of the invention, for example as shown in FIG. 4, is to provide a sufficiently low impedance path to this transient current, so that this high transient current is not conducted through the sensitive functional circuitry 10 of the device.

In the integrated circuit of FIG. 4, ESD energy from either of terminals PIN1, PIN2 to device ground GND will be safely conducted through respective ones of n-p-n transistors 4A, 4B, respectively. Signal terminal PIN1 is connected to the collector of n-p-n transistor 4A and to functional circuitry 10; the emitter of transistor 4A is connected to substrate ground GND (as is functional circuitry 10). Trigger 6A is connected between signal terminal PIN1 and the base of transistor 4A, and resistor 7A is connected between this node at the base of transistor 4A and device ground GND. As before, trigger 6A is any conventional element that defines the turn-on of transistor 4A. One example for trigger circuit 6A is simply a direct connection to the collector of transistor 4A, in the case where transistor 4A is to be turned on by collector-base junction breakdown resulting from an ESD event. Trigger 6A may also be an additional component, such as a Zener diode that conducts current from signal terminal PIN1 into the base of transistor 4A and resistor 7A when the Zener diode is in reverse-bias breakdown. Resistor 7A is preferably implemented as a polysilicon resistor. Transistor 4B is similarly configured between signal terminal PIN2 and external terminal GND.

Each of transistors 4A, 4B conduct ESD energy of positive polarity at external terminals PIN1, PIN2 relative to substrate ground GND. In such an event, the corresponding one of bipolar transistors 4A, 4B will safely conduct the ESD current as collector-emitter current. This ESD current thus is shunted from functional circuitry 10, protecting it from overcurrent damage from the ESD event.

As in the conventional structures described above relative to FIGS. 1 and 2, diodes 5A, 5B protect external terminals PIN1, PIN2 from damage due to negative polarity ESD events, relative to substrate ground GND. Typically, diodes 5A, 5B are simply the parasitic junction diodes between the n-type region serving as the collector of transistors 4A, 4B and the p-type substrate. A negative polarity ESD event at terminals PIN1, PIN2 will forward-bias diodes 5A, 5B, respectively, providing a low-impedance path. In normal operation, the low voltage at substrate ground GND relative to the terminals PIN1, PIN2 keeps diodes 5A, 5B reverse-biased, and transparent to functional circuitry 10.

ESD protection is provided between external terminal PIN1 and external terminal PIN2, without regard to substrate ground GND, and in both polarities, according to the preferred embodiments of the invention. This pin-to-pin ESD protection is especially important, and often required, for certain types of integrated circuits. Charge-pump circuits, voltage regulators, and other mixed signal integrated circuits, which have both analog and digital functions, typically require such protection. In addition, the voltage on one signal terminal (e.g., PIN1) may exceed the voltage on another signal terminal (e.g., PIN2) in the normal operation of mixed-signal functional circuitry 10; this operation must be considered in constructing the ESD protection structures between signal pins.

In the preferred embodiments of the invention, as in the conventional case of FIG. 2, n-p-n transistor 4C provides this protection in one polarity (terminal PIN1 to terminal PIN2, in the example of FIG. 4). External terminal PIN1 is connected to the collector of transistor 4C, and external terminal PIN2 is connected to the emitter of this device. Trigger 6C and resistor 7C are also connected in series between terminals PIN1, PIN2, with the base of transistor 4C connected to the node between trigger circuit 6C and resistor 7C. Transistor 4C will turn on in response to an ESD events of positive polarity at terminal PIN1 relative to terminal PIN2, providing a low-impedance path for this ESD energy, as described above.

Figure 3:
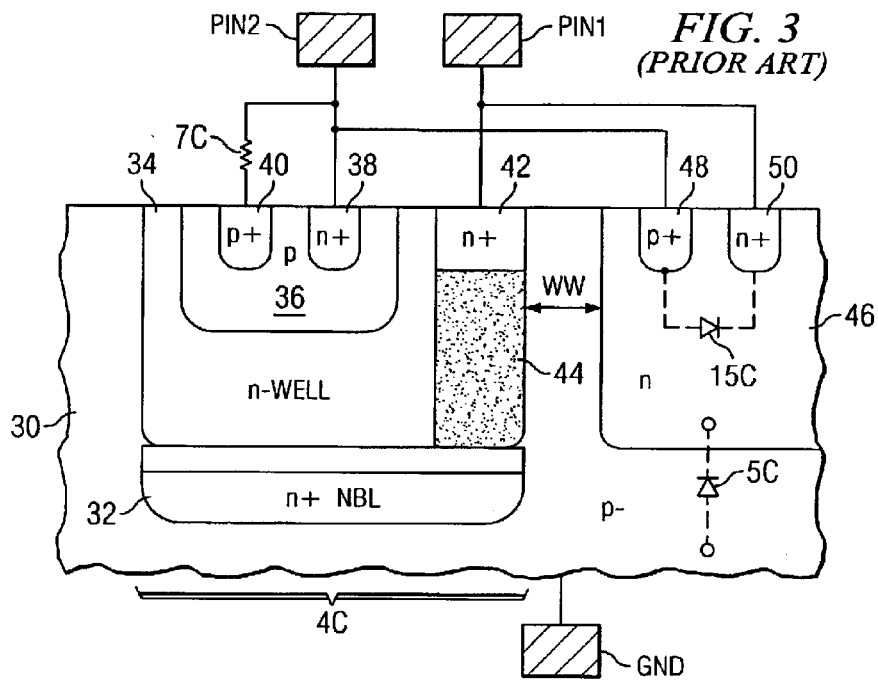
FIG. 3 is a cross-sectional diagram of the conventional ESD structure of FIG. 2.

According to the preferred embodiments of the invention, diode 25 is provided between signal terminal PIN1 and signal terminal PIN2, to protect functional circuitry 10 against ESD events of the opposite polarity, in this case with signal terminal PIN1 negative relative to signal terminal PIN2. According to the preferred embodiments of the invention, diode 25 is a junction diode, with its anode connected to signal terminal PIN2 and its cathode connected to signal terminal PIN1 via the collector of transistor 4C. As will be evident from the following description, diode 25 is implemented in an extremely space-efficient manner according to the preferred embodiments of the invention, particularly as compared against the conventional approach of FIG. 3 that includes an isolated diode 15C.

Figure 5A:
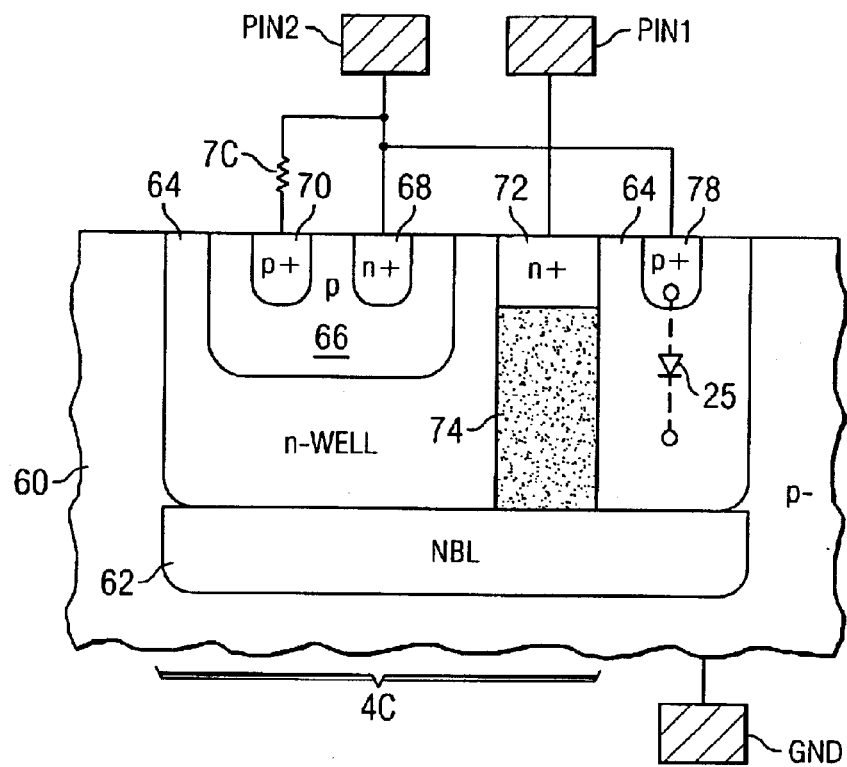
FIGS. 5a and 5b are cross-sectional and plan views, respectively, of an ESD protection structure according to a first preferred embodiment of the invention.
Figure 5B:
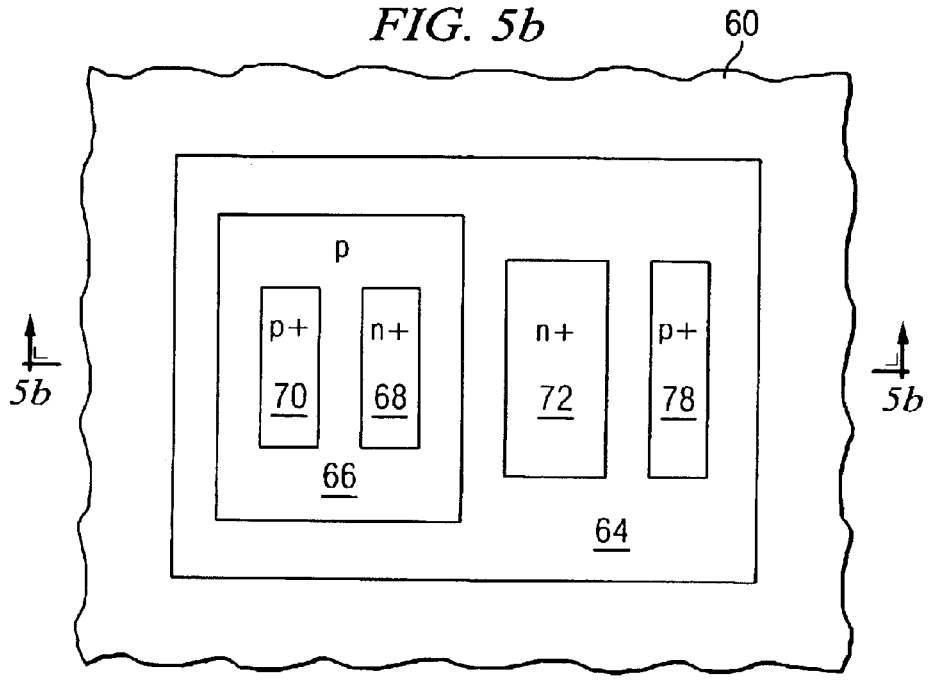

FIGS. 5a and 5b illustrate, in cross-section and plan views, respectively, the construction of an ESD protection structure corresponding to the circuit of FIG. 4, according to a first preferred embodiment of the invention. As mentioned above, this protection structure is provided to protect against damage to functional circuitry 10 due to an ESD event of either polarity between signal terminals, for example between signal terminals PIN1, PIN2.

As shown in FIGS. 5a and 5b, the structure is formed at a surface of p-type substrate 60, which in this case is directly or indirectly biased from substrate ground terminal GND in normal operation. At the selected location of substrate 60, n-type buried layer 62 is disposed, and serves as a subcollector for transistor 4C in this example. N-type buried layer 62 is formed in the conventional manner, for example as described in U.S. Pat. No. 4,958,213, commonly assigned herewith and incorporated herein by this reference. N-type well 64 is formed over n-type buried layer 62 in the conventional manner, for example as an implanted region within an epitaxial layer formed over buried layer 62, as also described in U.S. Pat. No. 4,958,213, and is substantially coincident with buried layer 62. In the plan view of FIG. 5b, therefore, buried layer 62 is not visible, as it substantially underlies n-well 64.

Transistor 4C has its base region formed within p-type well 66, formed in the conventional manner within n-well 64. The emitter of transistor 4C is formed by way of ion implanted n+ region 68 formed within p-well 66, for example by way of the same ion implantation process or processes used to form an n-type source/drain region for MOS transistors elsewhere within the integrated circuit. According to this embodiment of the invention, p+ region 70 is also formed within p-well 66, for example also by the same p-type implant used to form p-type source/drain regions for MOS devices elsewhere in the integrated circuit. This p+ region 70 is connected to signal terminal PIN2 by way of resistor 7C (preferably formed of polysilicon; not shown); n+ region 68 is connected directly to signal terminal PIN2, for example by way of a metal conductor (not shown).

In this embodiment of the invention, the collector contact of signal terminal PIN1 is made by way of n+ region 72 and buried contact plug 74, which directly contacts (or, in some cases, only approaches) buried layer 62. Buried contact plug 74 is a conductive contact to n-type buried layer 62, for example in the form of a heavily doped buried region formed by conventional techniques. N+ region 72 may then be formed into an epitaxial layer overlying plug 74, for example in the case where the remainder of the surface of substrate 60 is also formed in an epitaxial layer. Connection of n+ region 72 to signal terminal PIN2 is then made by way of a conventional metal conductor (not shown).

In this example, referring back to the circuit schematic of FIG. 4, trigger 6A is embodied simply by the connection of signal terminal PIN1 to the collector of transistor 6C, such that transistor 4C turns on in response to a positive polarity ESD event between signal terminals PIN1 and PIN2 that is sufficient to break down the collector-base junction. Referring to FIG. 5a, this breakdown will likely occur between n-type region 64 and p-well 66. Once this junction breaks down, current from signal terminal PIN1 will flow to signal terminal PIN2 via n+ region 68, and via p+ region 70 and resistor 7C. This current forward-biases the base-emitter junction at n+ region 68, initiating bipolar conduction through transistor 4C and thus providing a low-impedance collector-emitter current path for the ESD energy.

According to this embodiment of the invention, diode 25 is formed by the placement of p+ region 78 at a location within n-well 64. As evident from FIGS. 5a and 5b, p+ region 78 is located within the same n-well 64 that transistor 4C is disposed, preferably on the other side of the collector contact of n+ region 72 from the transistor base. This p+ region 78 is connected to signal terminal PIN2 by way of a metal conductor (not shown).

The dopant concentration and junction depth of p+ region 78 are preferably selected to ensure proper characteristics for diode 25. Referring back to the circuit schematic of FIG. 4, it is important that the reverse-bias breakdown voltage of diode 25 is at a voltage greater than that of the turn-on voltage of transistor 4C, so that transistor 4C (rather than diode 25) conducts positive polarity ESD energy. As described above, in this example, transistor 4C turns on by breakdown of its collector-base junction. Accordingly, the reverse-bias breakdown voltage of diode 25 must be higher than the breakdown voltage of the collector-base junction of transistor 4C. This may be ensured by forming p+ region 78 to a relatively deep depth, and perhaps with a relatively lower doping concentration than that of n+ region 72. For example, p+ region 78 may be formed within a region that receives the p-well implant. It is contemplated that such characteristics for p+ region 78 are available in the feature set for the integrated circuit being formed into substrate 60 in this example.

In some implementations, p+ region 78 within n-well 64 may insert some latchup vulnerability to the structure. However, it is contemplated that the presence of n-type buried layer 62 and plug 74 will generally prevent parasitic thyristor conduction in this embodiment of the invention, so latchup is likely to be of minimal concern in this implementation.

Diode 25, at the junction between n-well 64 and p+ region 78, thus provides protection for negative polarity (signal terminal PIN1 to PIN2) ESD events, by providing a low-impedance path for conduction in this direction. Should signal terminal PIN2 receive ESD energy of positive polarity relative to signal terminal PIN1, the p-n junction at p+ region 78 will forward bias relative to n-well 64. Current can then be safely conducted from p+ region 78 through n-well 64, to buried plug 74 and n+ region 72 to signal terminal PIN2. Functional circuitry 10 will thus be protected by diode 25 in this implementation. As evident from a comparison of FIGS. 5a and 5b to FIG. 3, the provision of p+ region 78, and thus diode 25, within n-well 64 provides important efficiencies in the fabrication of the integrated circuit. Because diode 25 is not isolated from n-well 64, as was isolated diode 15 relative to n-well 34 in FIG. 3, there is no need for the well-to-well spacing WW. This saves significant chip area in the integrated circuit, especially considering that typical well-to-well spacing requirements are on the order of 15 to 20 μm in modern technology. Considering that this spacing would be required for each implementation of the ESD structure, between each pair of signal terminals of the device, the chip area saved according to the present invention is substantial. In addition, the parasitic resistance necessitated by making connection over the well-to-well spacing is also eliminated, rendering improved device performance in response to ESD events.

Figure 6A:
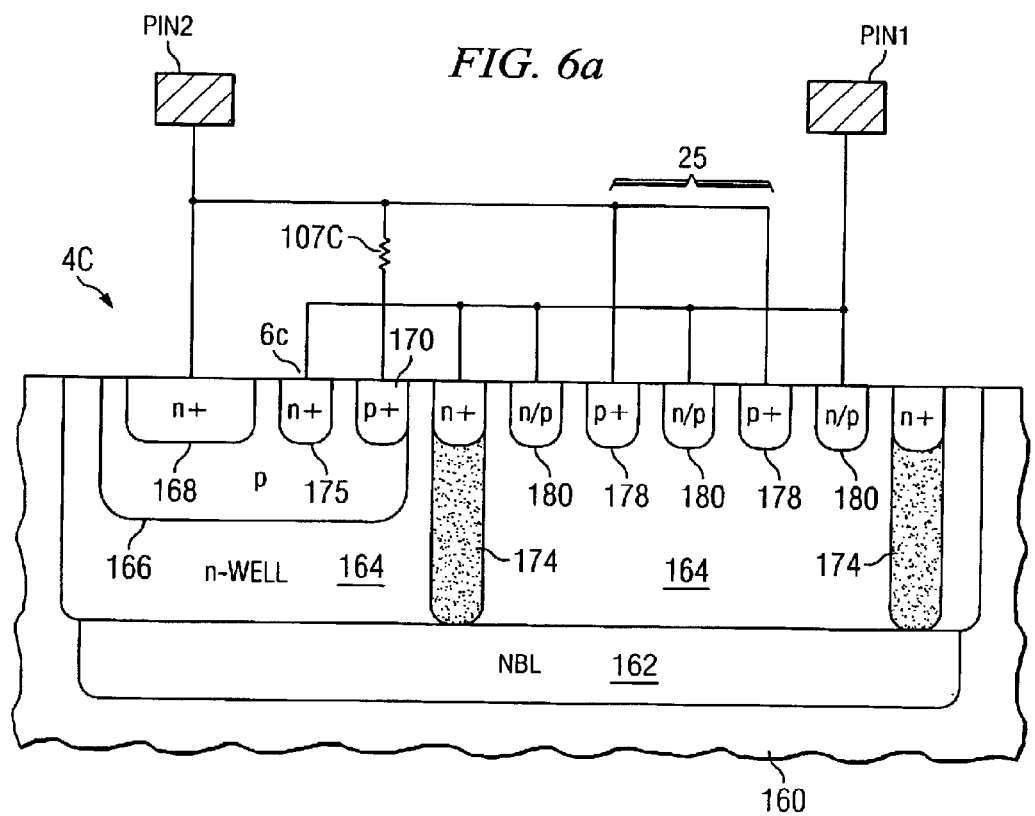
FIGS. 6a and 6b are cross-sectional and plan views, respectively, of an ESD protection structure according to a second preferred embodiment of the invention.
Figure 6B:
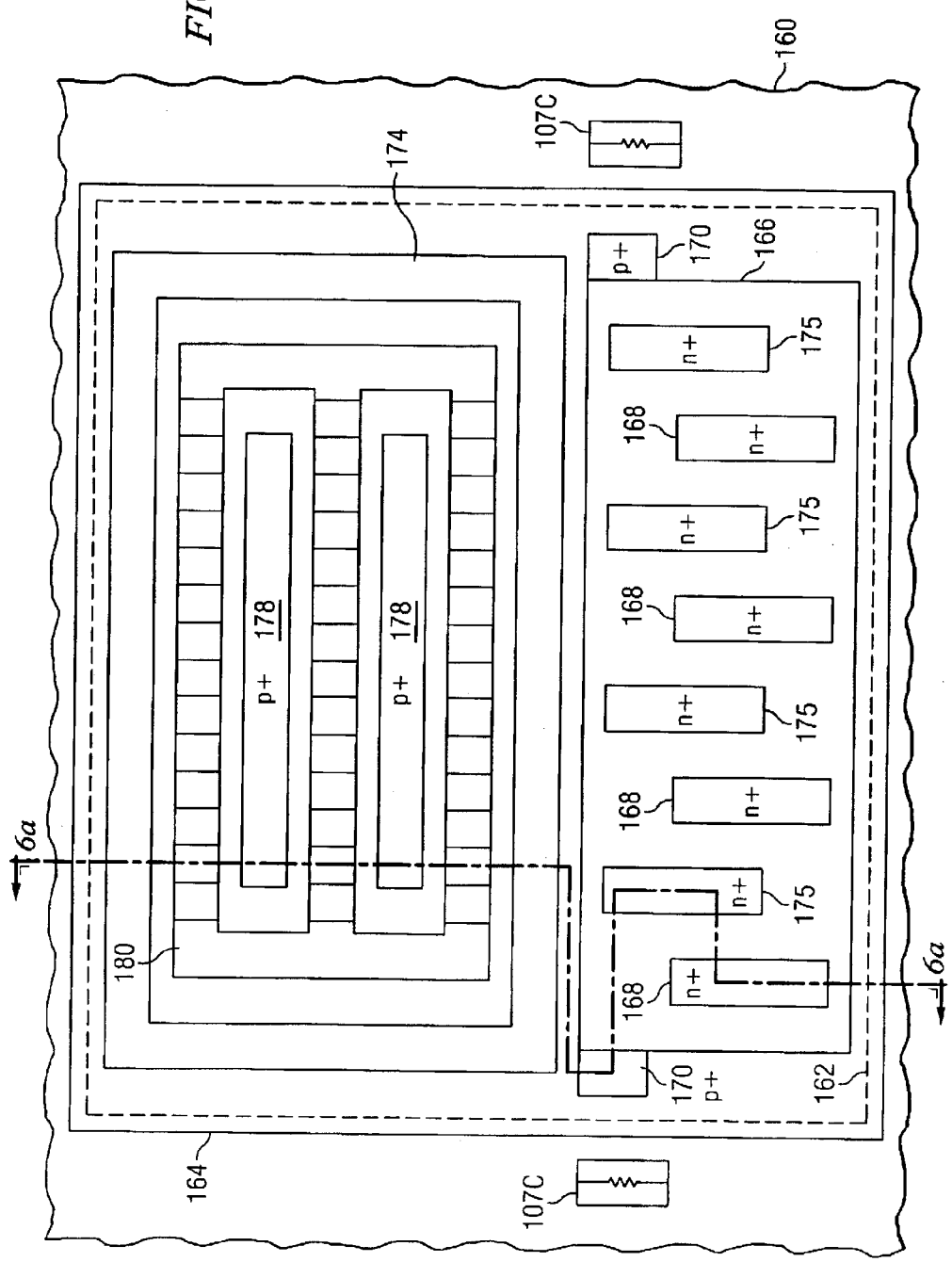

Other configurations of the ESD protection structure, for protection between signal pins, are also contemplated according to this invention. These various configurations can include additional components, as desired for a particular manufacturing technology or to attain certain performance objectives. FIGS. 6a and 6b illustrate, in cross-section and plan views, respectively, an example of such an alternative configuration. Metal levels are not illustrated in the plan view of FIG. 6b, for the sake of clarity.

As evident from FIGS. 6a and 6b, the ESD structure according to this embodiment of the invention incorporates bipolar transistor 4C and diode 25 (FIG. 4) within a single n-well 164; in this example, n-well 164 overlies n-type buried layer 162, both formed as described above. P-well 166 is disposed within n-well 164, serving as the base of transistor 4C, and contains multiple n+ regions 168 serving as the emitter of transistor 4C. N+ regions 168 are connected to signal terminal PIN2 by way of a metal conductor (not shown). Signal terminal PIN2 is also connected to p+ regions 170 at the periphery but within p-well 166, via a pair of polysilicon resistors 107C. The collector of transistor 4C at n-type buried layer 162 is contacted by buried plug 174, which is connected to signal terminal PIN1 as before.

In this embodiment of the invention, trigger 6A is implemented by way of a Zener diode, formed by way of n+ regions 175 formed into p-well 166 and connected to signal terminal PIN1. In the conventional manner, the Zener diode formed at the junction between n+ regions 175 and p-well 166 will breakdown at approximately a specified voltage, in response to a positive polarity ESD event at signal terminal PIN1 relative to signal terminal PIN2. Once this breakdown occurs, then current will flow into p-well 166 from signal terminal PIN1 to signal terminal PIN2, via p+ regions 170 and resistors 107C, and via n+ regions 168. The emitter-base junction at n+ regions 168 and p-well 166 will become forward-biased, enabling collector-emitter current from signal terminal PIN1 via plug 174 and n-type buried layer 162, through the base of p-well 166 and out of the emitter at n+ regions 168.

For negative polarity ESD events (signal terminal PIN2 at a higher potential than signal terminal PIN1), diode 25 is provided in this embodiment of the invention. Specifically, the anode of diode 25 is formed by p+ regions 178 within n-well 164, connected to signal terminal PIN2 (by metal conductors, not shown). The cathode of diode 25 is provided by n-well 164 itself, to which contact is made from signal terminal PIN1 via buried plug contacts 174 and n-type buried layer 162. In this manner, a positive potential due to an ESD event at signal terminal PIN2, relative to signal terminal PIN1, will forward bias the junctions between p+ regions 178 and n-well 164, providing a safe conduction path to signal terminal PIN1 via n-type buried layer 162 and plug contacts 174.

If desired, and if available from the technology, p+ regions 178 may be formed within a p-type base implant region disposed into n-well 164. This can provide a different characteristic for diode 25, particularly by increasing its reverse breakdown voltage.

Also in this embodiment of the invention, p+ regions 178 are surrounded by n+/p+ chains 180. These chains 180 are implemented by adjacent implanted n+ and p+ regions, alternating with one another along the horizontal direction (in FIG. 6b). Both conductivity-type regions in chains 180 are connected to signal terminal PIN1 by way of a metal conductor (not shown). N+/p+ chains 180 provide added protection against latchup, by negating any parasitic p-n-p transistor action that may otherwise initiate laterally between p+ regions 178 and p-well 166, through n-well 164.

According to this embodiment of the invention, the ESD protection structure is implemented in a significantly smaller region of the integrated circuit than would be possible if the reverse-bias diode were to be isolated in its own well, as in conventional devices. The construction according to this invention eliminates the need for well-to-well spacing between the reverse polarity ESD protection diode and the forward polarity ESD protection bipolar transistor. This reduced chip area is especially important considering that such protection structures are to be implemented between each pair of signal terminals in the overall device. In addition, the smaller structure area also reduces parasitic resistance of the conductors making contact to the protection elements, further improving device performance.

It will be apparent to those skilled in the art that other alternative implementations and modifications may also be used in connection with this invention. Specifically, different forward polarity structures may alternatively be used, including such devices as thyristors ("SCRs"), MOS transistors, and the like. In addition, it is contemplated that this invention will be useful in connection with a wide range of device types, including mixed-signal devices as noted above, as well as in pure digital and analog integrated circuits, fabricated by MOS, bipolar, BiCMOS, and other technologies.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A structure in an integrated circuit, for conducting energy from an electrostatic discharge (ESD) event between first and second signal terminals, comprising:
   a transistor, connected between the first and second signal terminals, and formed into a well of a first conductivity type, for conducting ESD energy from the first signal terminal to the second signal terminal; and
   a diode, having an anode connected to the second signal terminal and a cathode connected to the first signal terminal, the diode formed at a junction between a diffused region of a second conductivity type formed into the well and further comprising adjacent diffused regions of the first and second conductivity types formed within the well, and connected to the first signal terminal.

2. The structure of claim 1, wherein the cathode of the diode comprises the well.

3. The structure of claim 2, wherein the anode of the diode comprises the diffused region.

4. The structure of claim 3, wherein the transistor is a bipolar transistor, and comprises:
   a base region of the second conductivity type, formed within the well, the base region connected to the second signal terminal;
   an emitter region of the first conductivity type, formed within the base region, and connected to the second signal terminal;
   a collector contact structure, connecting the first signal terminal to the well.

5. The structure of claim 4, wherein the collector contact structure comprises:
   a diffused region of the first conductivity type formed into a surface of the well.

6. The structure of claim 5, wherein the bipolar transistor further comprises:
   a buried layer of the first conductivity type, underlying the well;
   and wherein the collector contact structure further comprises:
   a buried contact plug, in contact with the diffused region of the first conductivity type and with the buried layer.

7. The structure of claim 4, further comprising:
   a trigger element connected to the first signal terminal, for defining the turn-on conditions of the bipolar transistor.

8. The structure of claim 7, wherein the trigger element comprises:
   a diffused region of the first conductivity type formed within the base region, and connected to the first signal terminal.

9. The structure of claim 1, wherein the anode of the diode comprises:
   a plurality of diffused anode regions of the second conductivity type, each connected to the second signal terminal;
   and wherein the adjacent diffused regions are arranged as a plurality of chains of adjacent diffused regions of the first and second conductivity types formed within the well, one of the plurality of chains disposed between first and second ones of the plurality of diffused anode regions.

10. An integrated circuit formed at a semiconductor surface of a substrate, comprising:
    functional circuitry;
    a plurality of signal terminals coupled to the functional circuitry, for providing an external connection to the integrated circuit; and
    an electrostatic discharge protection structure coupled to first and second ones of the plurality of signal terminals, and comprising:
    a transistor, connected between the first and second signal terminals, and formed into a well of a first conductivity type, for conducting ESD energy from the first signal terminal to the second signal terminal; and
    a diode, having an anode connected to the second signal terminal and a cathode connected to the first signal terminal, the diode formed at a junction between a diffused region of a second conductivity type formed into the well, wherein the diode of the electrostatic discharge protection structure further comprises
    adjacent diffused regions of the first and second conductivity types formed within the well, and connected to the first signal terminal.

11. The integrated circuit of claim 10, further comprising:
    a plurality of ground electrostatic discharge devices, each coupled between an associated one of the plurality of signal terminals and a device ground, and comprising:
    a transistor, connected between the associated signal terminal and device ground, and formed into a well of a first conductivity type, for conducting ESD energy from the first signal terminal to device ground; and
    a diode, connected between device ground and the associated signal terminal, for conducting ESD energy from device ground to the first signal terminal.

12. The integrated circuit of claim 10, further comprising;
    a plurality of electrostatic discharge devices, each connected to an associated pair of said plurality of signal terminals, and each comprising:
    a transistor, connected between a first signal terminal in the associated pair of signal terminals and a second signal terminal in the associated pair of signal terminals, and formed into a well of a first conductivity type, for conducting ESD energy from the first signal terminal to the second signal terminal; and a diode, having an anode connected to the second signal terminal and a cathode connected to the first signal terminal, the diode formed at a junction between a diffused region of a second conductivity type formed into the well.

13. The integrated circuit of claim 10, wherein the cathode of the diode comprises the well.

14. The integrated circuit of claim 13, wherein the anode of the diode comprises the diffused region.

15. The integrated circuit of claim 14, wherein the transistor is a bipolar transistor, and comprises:
   a base region of the second conductivity type, formed within the well, the base region connected to the second signal terminal;
   an emitter region of the first conductivity type, formed within the base region, and connected to the second signal terminal;
   a collector contact structure, connecting the first signal terminal to the well.

16. The integrated circuit of claim 15, wherein the collector contact structure comprises:
   a diffused region of the first conductivity type formed into a surface of the well.

17. The integrated circuit of claim 16, wherein the bipolar transistor further comprises:
   a buried layer of the first conductivity type, underlying the well;
   and wherein the collector contact structure further comprises:
   a buried contact plug, in contact with the diffused region of the first conductivity type and with the buried layer.

18. The integrated circuit of claim 15, further comprising:
   a trigger element connected to the first signal terminal, for defining the turn-on conditions of the bipolar transistor.

19. The integrated circuit of claim 18, wherein the trigger element comprises:
   a diffused region of the first conductivity type formed within the base region, and connected to the first signal terminal.

20. The integrated circuit of claim 10, wherein the first conductivity type is n-type, and wherein the second conductivity type is p-type.

21. The integrated circuit of claim 10, wherein the anode of the diode comprises:
   a plurality of diffused anode regions of the second conductivity type, each connected to the second signal terminal;
   and wherein the adjacent diffused regions are arranged as a plurality of chains of adjacent diffused regions of the first and second conductivity types formed within the well, one of the plurality of chains disposed between first and second ones of the plurality of diffused anode regions.

* * * * *